(12) United States Patent
Kultran et al.

(10) Patent No.: US 11,469,722 B2
(45) Date of Patent: Oct. 11, 2022

(54) SYSTEMS AND METHODS FOR MODULAR POWER AMPLIFIERS

(71) Applicant: Epirus, Inc., Hawthorne, CA (US)

(72) Inventors: Denpol Kultran, Torrance, CA (US); Yiu Man So, Hawthorne, CA (US); Albert Montemuro, Redondo Beach, CA (US); Jacob Zinn Echoff, Redondo Beach, CA (US); Michelle Marasigan, Los Angeles, CA (US); Michael John Hiatt, El Segundo, CA (US); Jason Reis Chaves, Redondo Beach, CA (US); Michael Alex Borisov, Long Beach, CA (US); Jar Jueh Lee, Irvine, CA (US); Harry Bourne Marr, Jr., Manhattan Beach, CA (US)

(73) Assignee: Epirus, Inc., Hawthorne, CA (US)

( * ) Notice: Subject to any disclaimer, the term of this patent is extended or adjusted under 35 U.S.C. 154(b) by 192 days.

(21) Appl. No.: 16/908,476

(22) Filed: Jun. 22, 2020

(65) Prior Publication Data
US 2021/0399695 A1 Dec. 23, 2021

(51) Int. Cl.
*H03F 1/07* (2006.01)
*H03F 3/21* (2006.01)
(Continued)

(52) U.S. Cl.
CPC ............. *H03F 3/21* (2013.01); *H03K 19/173* (2013.01); *H03L 7/08* (2013.01); *H03F 2200/451* (2013.01)

(58) Field of Classification Search
CPC .................................... H03F 1/07; H03F 1/02
(Continued)

(56) References Cited

U.S. PATENT DOCUMENTS

| | | |
|---|---|---|
| 5,880,648 A | 3/1999 | Aves |
| 7,242,518 B1 | 7/2007 | Lynch et al. |

(Continued)

OTHER PUBLICATIONS

Patent Cooperation Treaty, International Search Report and Written Opinion issued in PCT/US2021/038529, dated Nov. 10, 2021, pp. 1-12.

(Continued)

*Primary Examiner* — Henry Choe
(74) *Attorney, Agent, or Firm* — Pillsbury Winthrop Shaw Pittman LLP

(57) ABSTRACT

Systems and apparatuses are disclosed that include a modular power amplifier having a power amplifier subsystem with a first 90 degree hybrid block configured to receive an RF signal and output a split RF signal with components having a 90 degree phase shift, a second 90 degree hybrid block configured to receive and combine the split RF signal by removing the 90 degree phase shift, a high-power amplifier configured to amplify at least one of the components of the split RF signal. The modular power amplifier also includes a power distribution module configured to regulate an amount of power input to the high-power amplifier and a power sequencer configured to control the timing of power delivery by the power distribution module. Three-dimensional power amplifiers having a first high-power amplifier and a second high-power amplifier having different orientations causing a reduction in electromagnetic interference are also disclosed.

14 Claims, 12 Drawing Sheets

(51) Int. Cl.
*H03L 7/08* (2006.01)
*H03K 19/173* (2006.01)

(58) Field of Classification Search
USPC .............................................. 330/124 R, 295
See application file for complete search history.

(56) References Cited

U.S. PATENT DOCUMENTS

| | | | |
|---|---|---|---|
| 7,256,650 B1* | 8/2007 | Stockert | H03F 1/0216 |
| | | | 330/124 R |
| 7,388,433 B1* | 6/2008 | Hecht | H03G 1/0088 |
| | | | 330/124 R |
| 7,508,338 B2 | 3/2009 | Pluymers | |
| 8,718,580 B2* | 5/2014 | Borodulin | H03F 1/0288 |
| | | | 455/127.1 |
| 9,065,163 B1 | 6/2015 | Wu | |
| 10,224,184 B2* | 3/2019 | Van Zyl | H01J 37/32146 |
| 10,938,347 B2* | 3/2021 | Rofougaran | H03F 1/02 |
| 10,958,323 B1* | 3/2021 | Ben-Yishay | G01S 7/4056 |
| 11,005,514 B2* | 5/2021 | Cordier | H03F 1/565 |
| 11,012,120 B2 | 5/2021 | Guillot | |
| 11,094,507 B2* | 8/2021 | Funk | H03F 3/21 |
| 2003/0227330 A1 | 12/2003 | Khanifar et al. | |
| 2006/0049870 A1 | 3/2006 | Hellberg | |
| 2008/0153435 A1 | 6/2008 | Hirano et al. | |
| 2008/0297414 A1 | 12/2008 | Krishnaswamy et al. | |
| 2010/0237884 A1 | 9/2010 | Bult et al. | |
| 2012/0200281 A1 | 8/2012 | Herbsommer et al. | |
| 2013/0120190 A1 | 5/2013 | McCune, Jr. | |
| 2014/0266460 A1 | 9/2014 | Nobbe et al. | |
| 2015/0061769 A1 | 3/2015 | Bodnar | |
| 2015/0270806 A1 | 9/2015 | Wagh et al. | |
| 2016/0036113 A1 | 2/2016 | Wu et al. | |
| 2016/0049909 A1 | 2/2016 | Scherrer | |
| 2016/0127060 A1 | 5/2016 | Cross | |
| 2016/0282450 A1 | 9/2016 | Kishigami et al. | |
| 2017/0180011 A1 | 6/2017 | Charvat et al. | |
| 2017/0359033 A1 | 12/2017 | Bazzani | |
| 2018/0131102 A1 | 5/2018 | Wang | |
| 2019/0058448 A1 | 2/2019 | Seebacher | |
| 2020/0036334 A1 | 1/2020 | Witt et al. | |
| 2020/0395894 A1 | 12/2020 | Esmael | |
| 2021/0057813 A1 | 2/2021 | So et al. | |
| 2022/0115782 A1 | 4/2022 | Marr et al. | |
| 2022/0158346 A1 | 5/2022 | Marr et al. | |

OTHER PUBLICATIONS

Patent Cooperation Treaty, International Search Report issued in PCT/US2020/021895, dated Jun. 9, 2020, pp. 1-2.

Manh et al., "An Independently Biased 3-stack GaN HEMT Configuration for 5G Mobile Networks", 2019 26th International Conference on Telecommunications (ICT), 2019, pp. 1-5, doi: 10.1109/ICT.2019.8798858.

Ampleon, "AN11226 TTL bias switching", Application note, Rev. 2, Sep. 1, 2015, pp. 1-13, The Netherlands B.V.

Barsegyan et al., "Bias Sequencing and Gate Pulsing Circuit for GaN Amplifier", 10th International Radar Symposium India, 2015, pp. 1-5, NIMHANS Convention Centre, Bangalore India.

Wang et al., "60% Efficient 10-GHz Power Amplifier With Dynamic Drain Bias Control", IEEE Transactions on Microwave Theory and Techniques, Mar. 2004, pp. 1-5, vol. 52(3).

Sheppard et al., "High-Power Microwave GaN/AlGaN HEMT's on Semi-Insulating Silicon Carbide Substrates", IEEE Electron Device Letters, Apr. 1999, pp. 161-163, vol. 20(4).

Korovin et al., "Pulsed Power-Driven High-Power Microwave Sources", Proceedings of the IEEE, Jul. 2004, pp. 1082-1095, vol. 92(7).

Delos et al., "Unique Gate Drive Applications Enable Rapidly Switching On/Off for Your High Power Amplifier", Analog Dialogue 51-12, Dec. 2017, pp. 1-4.

Gold et al., "Review of high-power microwave source research", Review of Scientific Instruments 68, 1997, pp. 1-31, 68, 3945, https://doi.org/10.1063/1.1148382.

Schafer et al., "X-Band MMIC GaN Power Amplifiers Designed for High-Efficiency Supply-Modulated Transmitters", IEEE Xplore, 2013 IEEE MTT-S International Microwave Symposium Digest (MTT), Jun. 2-7, 2013, pp. 1-3.

Pajic et al., "X-Band Two-Stage High-Efficiency Switched-Mode Power Amplifiers", IEEE Transactions on Microwave Theory and Techniques, Sep. 2005, vol. 52(9).

* cited by examiner

SYSTEMS AND METHODS FOR MODULAR POWER AMPLIFIERS

RELATED APPLICATION(S)

This application is related to U.S. application Ser. No. 16/779,036 filed Jan. 31, 2020 titled "APPARATUS AND METHOD FOR SYNCHRONIZING POWER CIRCUITS WITH COHERENT RF SIGNALS TO FORM A STEERED COMPOSITE RF SIGNAL," and U.S. Provisional Application No. 62/817,096, filed Mar. 12, 2019, the contents of each are hereby incorporated by reference.

DESCRIPTION OF THE RELATED ART

Radio-frequency (RF) applications often involve amplifying a RF signal to a power level suitable for applications in defense, policing, industrial applications, or the like. Amplifier arrays can be arranged in a 2D configuration, such as arranged on a single circuit board or the like, and some such circuits can be of significant size in order to contain the required number of amplifiers. Other approaches for RF amplification include radial combiners or Gysel combiners. While they allow some degree of redundancy such that the combiner can function if one is damaged, such combiners are often connectorized, making them difficult to repair.

SUMMARY

A modular power amplifier is disclosed that includes a power amplifier subsystem having a first 90 degree hybrid block configured to receive an RF signal and output a split RF signal with components having a 90 degree phase shift, a second 90 degree hybrid block configured to receive and combine the split RF signal by removing the 90 degree phase shift; and a high-power amplifier configured to amplify at least one of the components of the split RF signal. The modular power amplifier also includes a power distribution module configured to regulate an amount of power input to the high-power amplifier and a power sequencer configured to control the timing of power delivery by the power distribution module.

In some variations, the first 90 degree hybrid block can include comprising a resistor configured to dissipate at least a portion of RF power going through the first 90 degree hybrid block when the RF power is above a threshold. Also, the modular power amplifier can include a number of power amplifier subsystems, each of the power amplifier subsystems including the first hybrid block and the second hybrid block, where at least one of the plurality of the power amplifier subsystems replaces a high-power amplifier in another of the power amplifier subsystems to form a scaled power amplifier assembly.

Other variations can include waveform generation circuitry having a field-programmable gate array and a digital-to-analog converter, together configured to receive digital commands and a clock synchronization signal and to output the RF signal to the power amplifier subsystem and a phase lock loop circuit configured to provide clocking to the power amplifier synchronized with the clock synchronization signal.

In an interrelated aspect, also disclosed is a system having a power amplifier subsystem with a splitter configured to split an RF signal into a first RF component and a second RF component, a first high-power amplifier configured to amplify and output the first RF component, and a second high-power amplifier configured to amplify and output the second RF component. There may also be a differential antenna having a first input operatively connected to the first high-power amplifier to receive the first RF component and a second input operatively connected to the second high-power amplifier to receive the second RF component.

In another interrelated aspect, a modular power amplifier can have two power amplifier subsystems, each comprising: a first 90 degree hybrid block configured to receive an RF signal and output a split RF signal with components having a 90 degree phase shift, a high-power amplifier configured to amplify at least one of the components of the split RF signal, and a second 90 degree hybrid block configured to receive, combine, and output the split RF signal by removing the 90 degree phase shift. There may also be a differential antenna configured to receive the output of the second 90 degree hybrid blocks of the two power amplifier subsystems.

In yet another interrelated aspect, a three-dimensional power amplifier can include a first high-power amplifier configured to receive a first RF signal and output a first amplified RF signal, a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

In some variations, the first high-power amplifier and the second high-power amplifier are of generally planar construction and the generally planar amplifiers have the different orientations.

In other variations, the different orientations have an angle of 90 degrees between them to form a portion of a square distribution of high-power amplifiers.

In some variations, the three-dimensional power amplifier can include a cooling component located between the first high-power amplifier and the second high-power amplifier. Furthermore, the first high-power amplifier and the second high-power amplifier can be configured to receive the first RF signal and the second RF signal, both signals having a wavelength, and the first high-power amplifier and the second high-power amplifier are separated by at least approximately half of the wavelength.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also contemplated that may include one or more processors and one or more memories coupled to the one or more processors. A memory, which can include a computer-readable storage medium, may include, encode, store, or the like, one or more programs that cause one or more processors to perform one or more of the operations described herein. Computer implemented methods consistent with one or more implementations of the current subject matter can be implemented by one or more data processors residing in a single computing system or across multiple computing systems. Such multiple computing systems can be connected and can exchange data and/or commands or other instructions or the like via one or more connections, including but not limited to a connection over a network (e.g., the internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to particular implementations, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

The present disclosure provides examples of systems and methods for power amplifiers that provide several benefits over the state of the art. For example, amplifier systems are disclosed that have higher power density, are compact, scalable, have improved cooling, have reduced electromagnetic interference (EMI), etc. Such features are important for providing compact, high-power RF amplification, with applications in industry, defense, radar, communications, signal jammers, etc.

Figure 1:
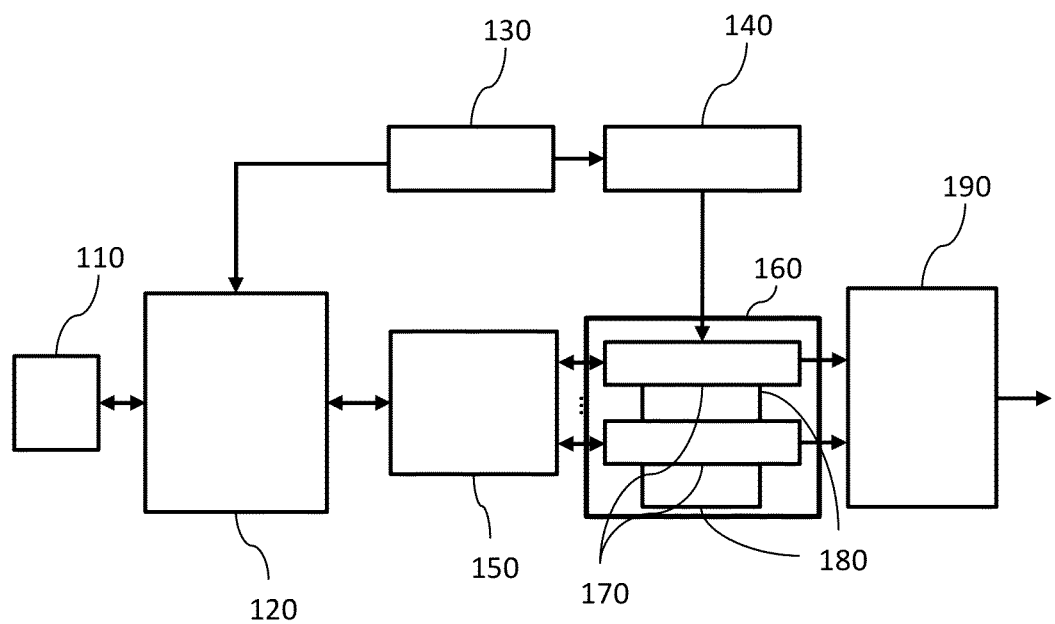
FIG. 1 is a simplified block diagram illustrating an amplifier and control system, in accordance with certain aspects of the present disclosure.

The overall system, as shown in FIG. 1, is designed for high power radio frequency transmissions, such as in high power microwave, directed energy, radar, and communications applications. The mission computer 120 runs the software code controlling the system, generally receives control commands, and prioritizes the hardware according to those commands. For example the mission computer, in a directed energy application, receives inputs about the location of targets such as automated target cues from an external radar, from a user who is using a user console to select targets, or from an automated target recognition and classification software based on image or radar inputs. The mission computer 120, also receives firing commands from a user such as whether to fire. The mission computer has many different modes it can run even for a firing command such as to raster a beam around a target, how many shots to fire, and in target swarm scenarios, which target to prioritize first for firing. Resource management decisions such as which targets to fire on first, such as the closest target, how many targets can be fired on with a single beam such that multiple targets fit within the same beam width, how fast the pulse width of the waveform needs to be, what frequency and what pulse repetition interval the waveform needs to be are all automatically decided based on a target recognition system or through user command resides in the mission computer 120. The mission computer, 120 can translate these into beam steering commands and waveform commands into phase and waveform commands for the hardware to produce to send to the waveform generator or the RF field programmable gate array (FPGA) 150. These waveform commands are also synchronized with the line replaceable amplifier modules, 170. In some embodiments the waveform is generated directly in the amplifier modules 170, if a direct digital synthesizer or waveform generator is contained in the amplifier modules, 170, instead of the waveform generator RF FPGA 150. The unit is generally connected to a generator or some other power Alternating Current (AC) power source, and this connection is made through the AC power system 130. The AC power system often has current monitoring, current control, and on/off switches that are controlled in the preferred embodiment by the mission computer 120. The AC power system also translates voltages and can also translate from AC to DC with AC/DC conversion. In some systems this AC/DC conversion happens in a centralized way right after the AC power is received from the AC power unit 130, or in other embodiments the AC/DC conversion is done locally on each power amplifier module 170, where each one has its own power distribution unit 140. In some embodiments the AC/AC conversion and AC/DC conversion is done in multiple steps, where voltage and current levels are changed, this is done in the AC power unit 130. The power distribution unit (PDU), 140 will generally translate the voltage to the final direct current (DC) voltage needed by each amplifier input. In the preferred embodiment, there are 65 volt, 50 volt, and 12 volt regulators on board the power distribution unit for the power amplifier module voltages that are needed. The PDU 140 regulates these voltages, also stores energy to provide impulses of power without the voltage level drooping, and generally is in charge of providing a constant DC voltage to the power amplifier modules 160. The PDU 140 may also have current sensors, current monitoring, and current limiters. The system is a phased array configuration, so multiple power amplifier can connect to an antenna element to create an array of radiating antennas 180. These antenna elements 180, can have special connectors designed to handle very high voltage levels and power levels, in the directed energy application and must have their impedance well matched to the power amplifier modules. In other embodiments of this system, the antenna elements, 180 are also used to receive RF energy and this RF energy is fed back into the transmit/receive modules, 170. Overall, the mission computer 120 commands waveforms and the power sources, the power sources 130 and 140 translate power into the precise voltages and currents needed on the power amplifiers, the power amplifiers 160 and 170 amplify the RF signal to very high levels and radiate out of the antennas 180.

One exemplary system utilizing concepts disclosed herein is illustrated in FIG. 1. Shown is a user input device 110, which can be a computer, tablet, smartphone, or any computing device capable of receiving text, mouse, touch, voice commands, etc. from a user. Such input or commands from input device 110 can be received at one or more computers 120 controlling operation of an amplifier system. Computer 120 can also be in communication with power supplies for the amplifier systems disclosed herein. For example, an AC (or DC) power supply 130 can be controlled by computer 120 to deliver power to a power distributor 140.

The actual RF pulse amplified by the amplifier systems disclosed herein can be generated from one or more RF FPGAs 140 that may be in communication with computer 120. The RF FPGA generates the radio frequency waveforms through a digital to analog converter (DAC). The DAC can have a digital input which can receive a stream of binary data that represents the amplitude of the analog waveform that is output. This binary data can be fed from computer memory where the binary representation of the samples of a waveform is stored or the binary data can be generated by direct digital synthesizers (DDS). Some embodiments may include an array of DACs, each with its own binary stream. The binary stream can be controlled such that there is a phase offset between the waves going to the different DACs to create a phased array.

RF FPGA 140 can provide RF signals to be amplified to an amplifier assembly 160 containing an arbitrary number a modular power amplifiers 170. As described in further detail herein (e.g., with reference to FIGS. 7-9), such modular power amplifiers 170 can have an efficient 3D configuration in the amplifier assembly, allowing for numerous technical improvements over conventional 2D amplifier systems. For example, cooling elements such as fans, heat sinks, etc. can be interspersed within the amplifier assembly between two or more of the modular power amplifiers. The output of the modular power amplifiers can then be delivered to an antenna array 190, which may be an EMP system.

Examples of applications of the disclosed systems can include L-band systems capable of providing RF power output in the kilowatt range (e.g., 1 kW, 3 kW, 5 kW, 12 kW, 20 kW, etc.), though power output will vary with implementation and should not be limited to the examples provided. Similarly, the RF frequencies that may be utilized in the disclosed systems need not be limited to L-band systems but may include other frequencies as well.

Figure 2:
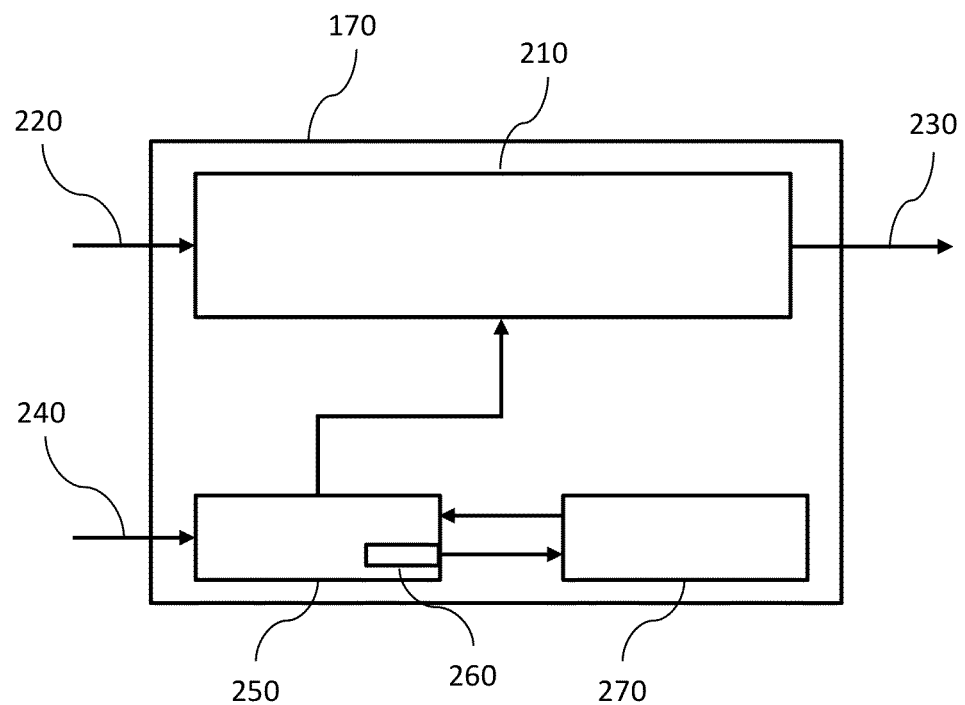
FIG. 2 is a simplified block diagram illustrating a modular power amplifier, in accordance with certain aspects of the present disclosure.

A block diagram of an exemplary modular power amplifier is illustrated in FIG. 2. The modular power amplifier 170 can include an amplifier subsystem 210, which can receive RF input signal 220 and provides an amplified RF output signal 230. Modular power amplifier 170 can receive input power 240 at a power distribution module 250 and a power sequencer 270. These components can provide power for components of the modular power amplifier, as described in further detail herein. In this way, an amplifier subsystem 210 can be independently controlled to provide a particular RF output signal.

In some implementations, power distribution module may include a current sensor 260 for monitoring of current output to the amplifier subsystem. The current sensor can then provide information to the power sequencer to adjust the power output from the power distribution module. Reading the current of the power amps during operation alerts the system to the health of the power amplifiers, that the current is within the expected range. The current also enables the system to infer the temperature of the power amplifiers during operation since the current will rise for a given power output as the temperature increases. The current sensor can also be used to detect the set point of the power amplifiers prior to operation; when the power amplifiers are off with no RF input, leakage current will change as a function of the bias current being applied. This leakage current is read in the current sensor until the desired current is detected, and thus gives the desired gate voltage set point that should be applied during operation. In one embodiment, the set point can be detected automatically prior to operation by slowly tuning the gate bias voltage until the ideal leakage current is detected. This voltage bias set point can be stored in memory and then during operation, applied when RF is applied. If the current reading is either very low, indicating the power amplifier is no longer pulling any power, or it is very high, indicating a short, this indicates the power amplifier is no longer operational. In this way, the health of the power amplifier can be determined by reading the current.

The power distribution module 250 can be configured to regulate an amount of power input (e.g., input power 240) to intermediate power amplifier(s) (see, e.g., FIG. 3) of the amplifier subsystem. Specifically, the power distribution module 250 can receive power at a given voltage, but provide power as needed (e.g., 50V, 65V, etc.) to the amplifier subsystem.

The power distribution module 250 provides several features. First it can regulate the voltage received from the power supply to the power amplifiers, such as a 50 volt supply to the drain of the gallium nitride power amp transistors. In some embodiments, the power distribution unit can provide DC to DC conversion of the voltage (e.g., acting as a voltage divider), such as if the incoming voltage from the power supply is much higher than the power amplifier voltage. Second, power distribution module 250 can contain current sensor 260 where the power distribution unit 270 detects the current and reports the current back to the power sequencer for use in determining gate voltage bias set point and power amplifier health. Third, the power distribution unit 250 can also provide a current limiter to limit the current to the power amplifiers; this prevents the power amplifiers from blowing out should any errors occur such as a short, electromagnetic interference, loss of power, or other causes that would cause an incorrect gate bias voltage, and thus a dangerous over-current situation without a current limiter. In some embodiments, no more than 3 amps of current can go through the power amplifiers before failure, so such a current limiter on the PDU can be set to 3 amps. The power distribution unit consists of voltage regulators, analog to digital converters to read the current, as well as a current limiter circuit made of transistors, diodes and resistors.

In some implementations power sequencer 270 can be configured to control the timing of power delivery by the power distribution module. For example, the power sequencer can turn on or off the gate bias to the intermediate power amplifiers in synchronization with the RF input. This has the benefit of controlling the power and improve heat dissipation. The power sequencer circuit can include analog to digital converters (ADC) to read voltages and currents from power amplifier circuits, digital to analog converters (DAC) to apply voltages to power amplifier circuits, such as gate bias voltages, as well as a processor such as a microcontroller or field programmable gate array (FPGA). The power sequencer can have digital input pins for receiving commands when radio frequency signals are being applied to the amplifier circuit. In this way the power sequencer can apply a gate bias voltage to turn the power amplifier "ON" just as RF signals are flowing through the power amplifier and then remove the gate bias voltage to turn the power amplifier "OFF" when no RF is flowing to save power. The power sequencer also has a memory to store gate bias set points. In the preferred embodiment, the power sequencer can have a plurality of ADCs and DACs to control multiple power amplifiers simultaneously.

Figure 3A:
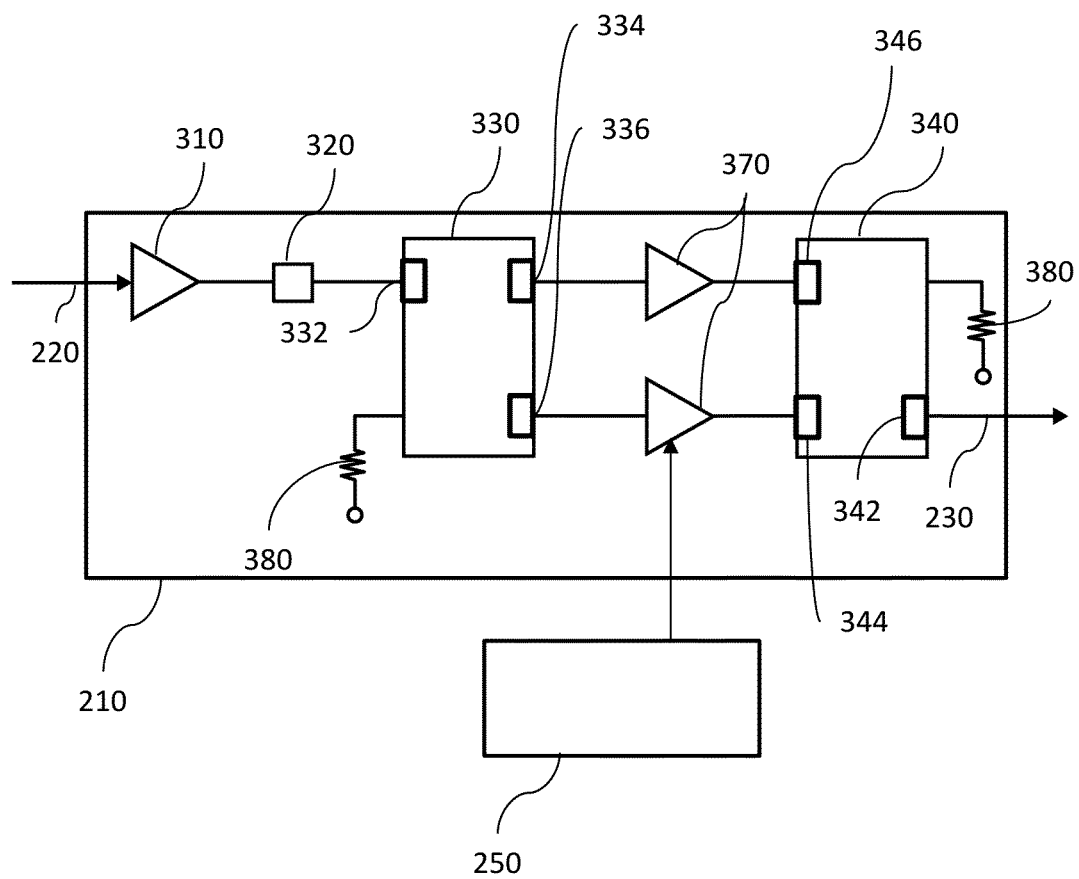
FIG. 3a is a simplified block diagram illustrating an amplifier subsystem, in accordance with certain aspects of the present disclosure.

Amplification of the RF input signal for a given modular power amplifier occurs in one or more amplifier subsystems. As shown in FIG. 3a, an example amplifier subsystem 210 (of modular power amplifier 170) can receive RF input signal 220 at an optional preamplifier 310, which is in turn connected to bandpass filter 320. Bandpass filter 320 can limit the frequency ranges of the signals passing through the system to a specified bandwidth. Power amplifiers can provide higher power out and higher gain when the bandwidth is smaller, so limiting bandwidth helps increase the gain and power of the amplifier system. Bandpass filter 320 can also eliminate out-of-band spurs, harmonics, and other out-of-band content. In other embodiments, bandpass filter 320 can instead be a low-pass filter or a high-pass filter to eliminate either high frequency content or low frequency content, respectively.

Amplifier subsystem 210 can also include, in some implementations, a number of 90 degree hybrid blocks that can split or combine an RF signal by respectively adding or removing a 90 degree phase shift to the split RF signal. Such RF signal components can be amplified individually and later recombined. For example, a first 90 degree hybrid 330 can be configured to receive an RF signal and output a split RF signal with components having a 90 degree phase shift. As shown in FIG. 3, 90 degree hybrid 330 can have RF i/o port 332, a "0 degree" port 334, and a "90 degree" port 336. The 90 degree hybrid 330 receives the RF signal at the RF i/o port 332 and the split RF signal components are respectively output through the 0 degree port 334 and the 90 degree port 336.

A similar, or even identical, second 90 degree hybrid block 340 in the amplifier subsystem 210 can be configured to receive and combine the split RF signal by removing the 90 phase shift. As apparent from FIG. 3a, the unshifted RF signal component from the 0 degree port 334 goes into the 90 degree input port 346. Similarly, the shifted RF signal component from the 90 degree port 336 goes into the 0 degree input port 344. The two signals can be combined and output through RF i/o port 342.

In some implementations, a high-power amplifier(s) 370 can be configured to amplify at least one component of the split RF signal. For improvement of the amplification process, the bias for the high-power amplifier 370 can be independently controlled via the power distribution module. The 90 degree hybrid combiner 340 combines the two high-power amplifiers 370, to create a signal of double the power that the individual high-power amplifier 370, can produce, and transmits this out of the output port of the hybrid power amp 230. In FIG. 3, the power distribution module 250 and power sequencer module 270, are connected to the high-power amplifiers 370. In one embodiment, the power sequencer 270 can control the gate bias voltage to some or all of the amplifiers in the hybrid combination network such that they are synchronized. In some embodiments, the power sequencer module 270 turns on the pre amplifiers 310 just before the high power amplifiers 370.

In other implementations, any/either/both 90 degree hybrid block can include a resistor configured to dissipate at least a portion of RF power going through the 90 degree hybrid block when the RF power is above a threshold. For example, such power dissipation can be used to reduce voltage standing wave ratio effects, thus improving the robustness of the amplifier system.

In many power amplifier systems the voltage standing wave ratio (VSWR) is a critical parameter. VSWR measures the total amount of power vs. how much power is transmitted and radiated out of the antenna. If power gets reflected back into the power amplifier system, this reduces the efficiency of the power amplifier system since not all of the power gets radiated, and high power levels such as with high power microwave and electromagnetic pulse applications, jamming, and high power radar, will damage the power amplifier system. In implementations using other means of power combining, such as using gysel combiners or radial combiners, if one leg of the circuit fails due to lack of protection, the entire 2-way, 4-way, or many-way combined gysel or radial circuit will completely fail. In this way, the disclosed resistive dissipation provides a significant technical improvement over prior art systems. While one VSWR ratio that is usually acceptable is no more than 2:1, 1.5:1 can be used for conservative systems. Power combiners, such as this 90 degree hybrid approach, can dissipate VSWR levels at up to 10:1 (and potentially higher) and so is very safe. VSWR depends on how well matched the resonant frequency of the power amplifier circuit is to the resonant frequency of the antenna. In some implementations, matching circuits can be created such that multiple frequencies are resonant in the power amplifier and the antenna is broadband and covers many frequencies. As the frequency being transmitted differs from the resonant frequency the VSWR gets worse. Temperature variations also degrade VSWR, other antenna elements in an array mutually coupling also degrades VSWR, anything that changes the impedance of the circuit changes VSWR. Thus, VSWR can change very dynamically throughout the operation of a radio frequency system, and instantaneously, it is possible for the VSWR to reach to very high levels such as up to 10:1 (or more), illustrating the benefits of the disclosed protective circuit.

Figure 3B:
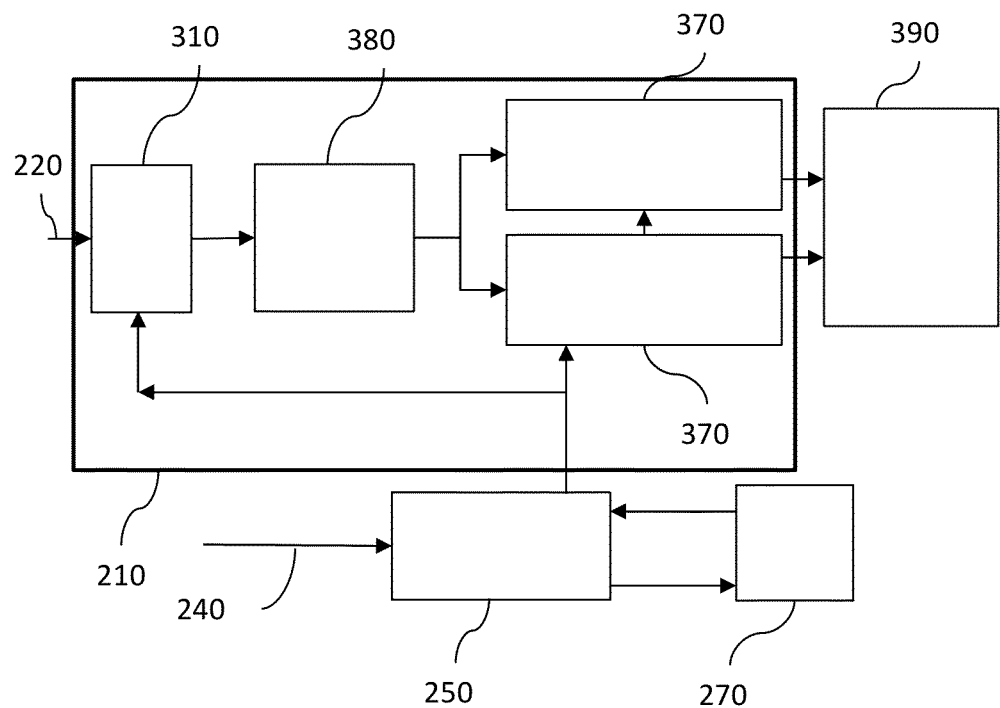
FIG. 3b is a simplified block diagram illustrating an amplifier subsystem implemented with a differential antenna, in accordance with certain aspects of the present disclosure.
Figure 3C:
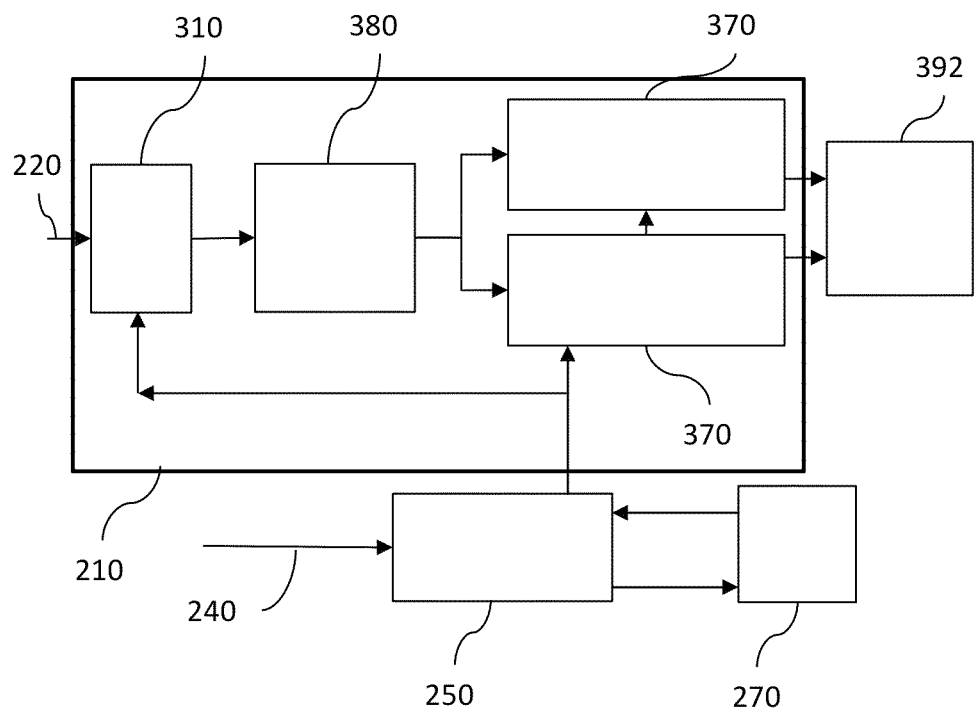
FIG. 3c is a simplified block diagram illustrating an amplifier subsystem implemented with an antenna array, in accordance with certain aspects of the present disclosure.
Figure 3C:
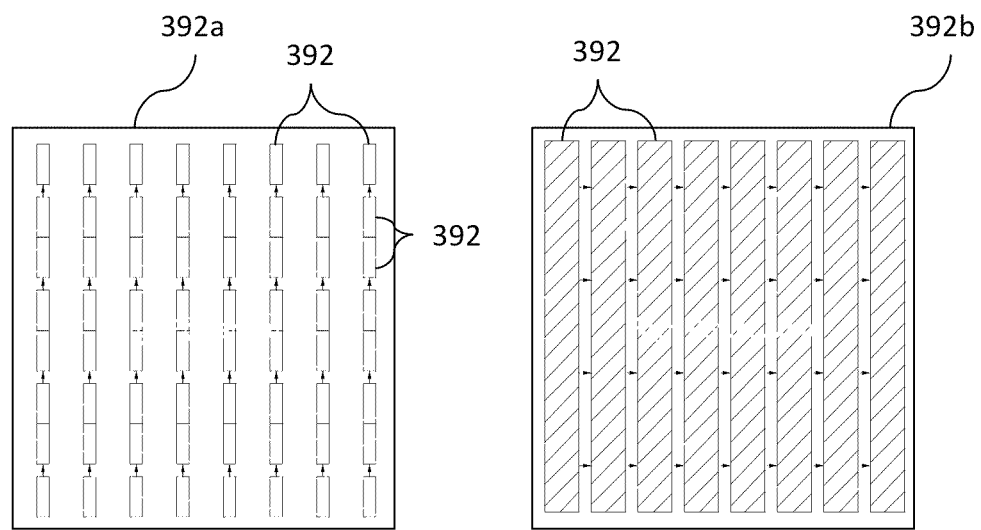
Figure 3D:
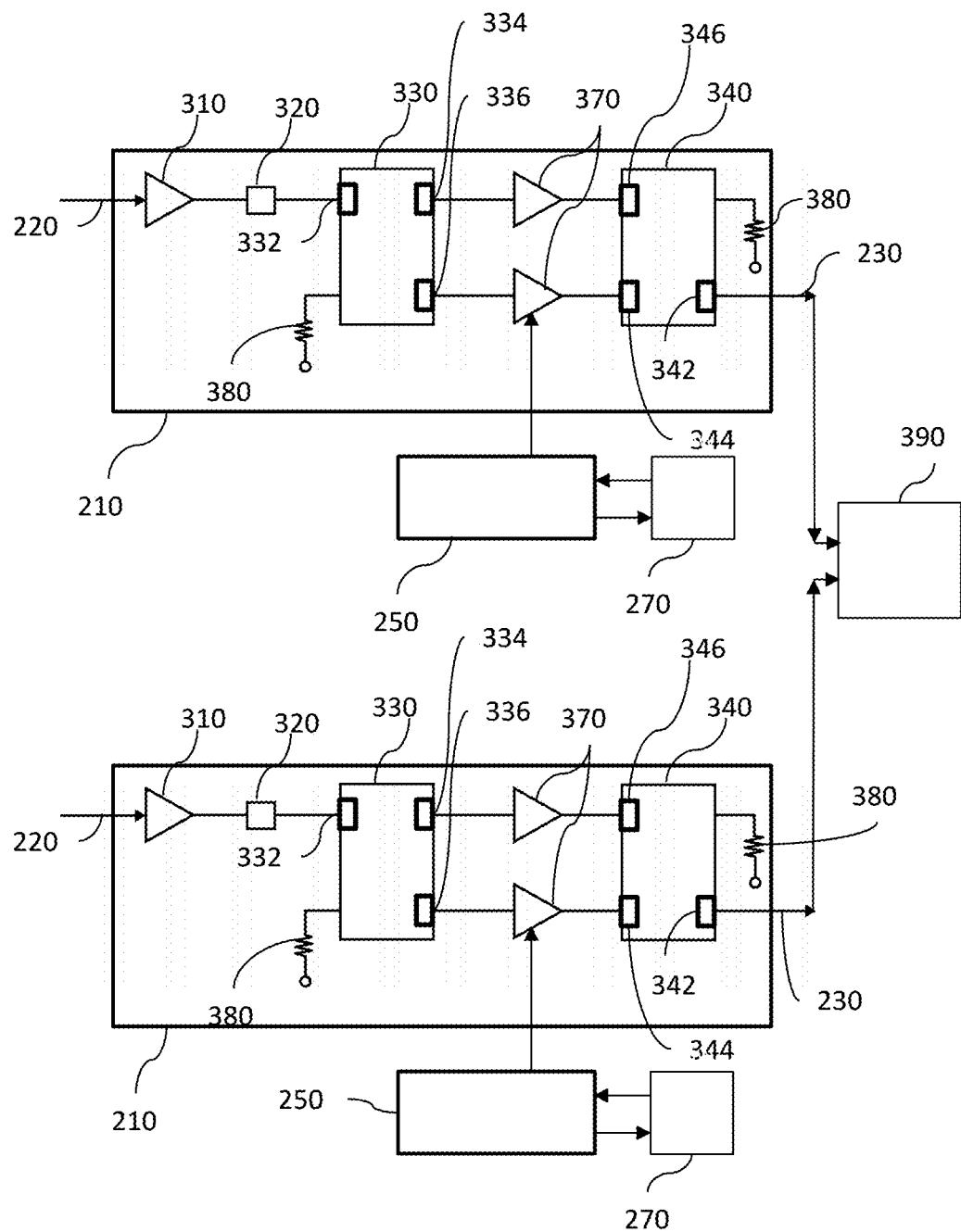
FIG. 3d is a simplified block diagram illustrating multiple amplifier subsystems implemented with a differential antenna, in accordance with certain aspects of the present disclosure.

FIGS. 3b-3d illustrate embodiments utilizing a differential antenna with certain aspects of the present disclosure. FIG. 3b illustrates an exemplary power amplifier subsystem having a splitter 380 configured to split an RF signal into a first RF component and a second RF component. Such a splitter can be configured to split the RF signal into two RF components of varying amplitude (e.g., a 50/50 splitter, 70/30 splitter, etc.). The system can further include a first high-power amplifier 370 configured to amplify and output the first RF component and a second high-power amplifier 370 configured to amplify and output the second RF component. The high-power amplifiers 370 in FIGS. 3b-d can be similar to other high-power amplifiers disclosed herein (e.g., high-power amplifier 370 as discussed with reference to FIG. 2).

Differential antenna 390 can have a first input operatively connected to the first high-power amplifier to receive the first RF component and a second input operatively connected to the second high-power amplifier to receive the second RF component. In some embodiments this embodiment can reduce the number of (or eliminate entirely) the need for combining circuitry. In any of the disclosed implementations, the differential antenna can be a high-impedance low-profile planar aperture 392. A number of such high-impedance, low-profile apertures 392 can be implemented to form an array such as a connected dipole array 392a, or its conjugate, a long-slot array antenna 392b with orthogonal polarization, as also illustrated in FIG. 3c. The connected dipole array can include gaps having an approximately 300-ohm gap impedance (denoted by the arrows between various high-impedance, low-profile apertures 392). The long-slot array antenna 392b can include an array of long slots excited at Nyquist interval by differential amplifiers. One advantage of such designs is eliminating the need of a conventional balun, and hence reducing the depth of the array antenna and the front-end RF loss.

FIG. 3d illustrates how the previously disclosed amplifier subsystems 210 can be utilized with a differential antenna. Here, a modular power amplifier can have two power amplifier subsystems. Each power amplifier subsystem can include a first 90 degree hybrid block configured to receive an RF signal and output a split RF signal with components having a 90 degree phase shift, a high-power amplifier configured to amplify at least one of the components of the split RF signal, and a second 90 degree hybrid block configured to receive, combine, and output the split RF signal by removing the 90 degree phase shift. Similar to the implementations in FIGS. 3b,c, a differential antenna can be configured to receive the output of the second 90 degree hybrid blocks of the two power amplifier subsystems.

Figure 4:
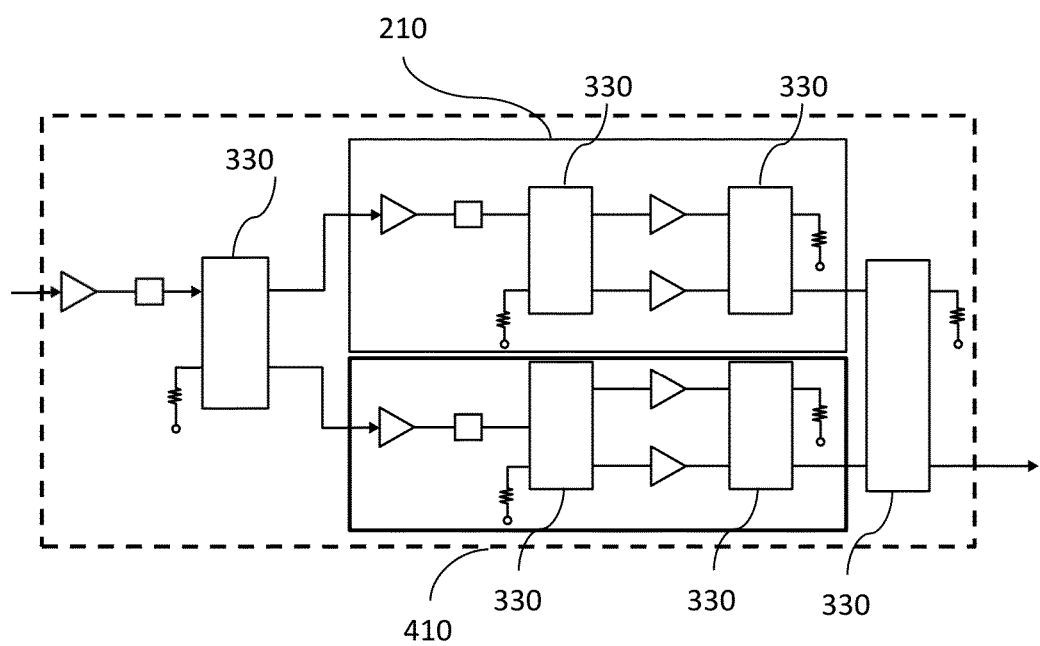
FIG. 4 is a simplified diagram illustrating the combining of amplifier subsystems into a scaled power amplifier assembly, in accordance with certain aspects of the present disclosure.

FIG. 4 illustrates how implementations of the present disclosure can allow the formation of a scaled power amplifier assembly 410 that combines multiple amplifier subsystems into a circuit equivalent to a single amplifier subsystem but having increased gain. In the example of FIG. 4, two power amplifier subsystems are shown, each including the first hybrid block and the second hybrid block. However, these power amplifier subsystems 210 are integrated into scaled power amplifier assembly 410 where they have replaced the intermediate power amplifier(s) in another power amplifier subsystem to form the scaled power amplifier assembly 410. Such scaling can be extended to combine any number of power amplifier subsystems in a scaled power amplifier assembly (that may itself be made up of scaled power amplifier assemblies). While the implementation in FIG. 4 illustrates the combination of three power amplifier subsystems, any number of power amplifier subsystems can be utilized, for example, 2, 4, 5, 6, 10, etc.

Figure 5:
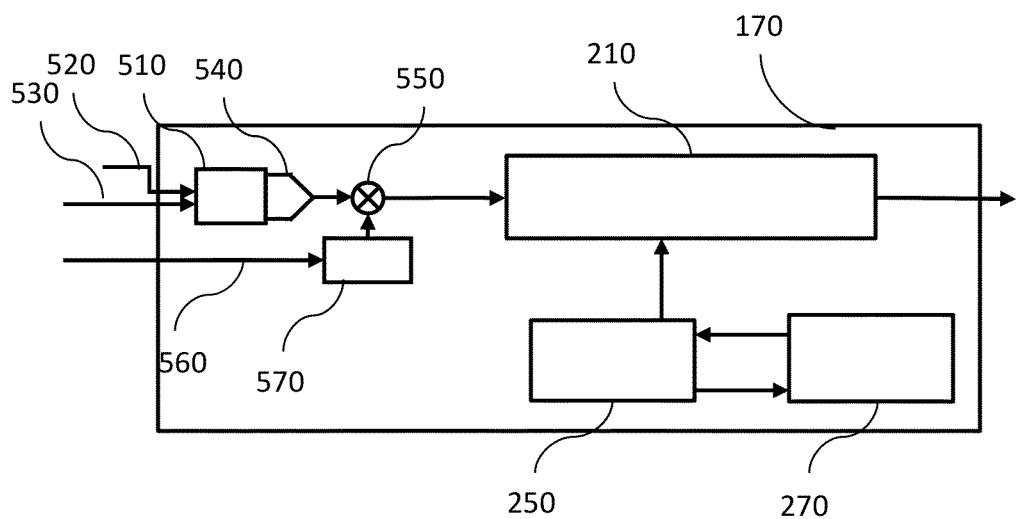
FIG. 5 is a simplified block diagram illustrating the generation of RF signals for amplification, in accordance with certain aspects of the present disclosure.

In some embodiments, as shown in FIG. 5, the waveform generation circuitry is embedded into the amplifier module 170 itself instead of having a radio frequency signal be provided as input to the amplifier module. This is a distributed method of waveform generation where a digital command is provided to the input of the amplifier module 170 instead of a radio frequency input. In some embodiments, the input 530 will contain a digital message with a phase offset value, amplitude, and a frequency value to command the module to transmit an RF waveform with the specified waveform and phase offset. These commands can also become more complex such as a series of commands such that the amplitude, phase offset and frequency vary as a function of time. A clock sync signal 520 can be input that originates at a common source such as a master clock with the purpose of synchronizing multiple power amplifier modules so they can transmit commands phase-coherently to one another. This clock sync pulse can be used to align the digital clocks within the module to the sync pulse. The phase locked loop (PLL) sync clock 560 can be input into a PLL circuit 570 such that the PLL circuit 570 provides the clocking to the rest of the module and synchronizes with the PLL input 560 as another mechanism to synchronize the clocks. In some embodiments, an FPGA 510 and digital to analog converter 540 receive digital commands and the clock synchronization signal and translate the digital commands into a radio frequency signal for the power amplifier subsystem. In other embodiments, a direct digital synthesizer (DDS) chip is used instead of an FPGA and a DAC. In some embodiments, the RF signal generated from the DAC 540 is a sufficiently high frequency and is converted to the desired RF frequency by the DAC and input into the amplifier module 210. In other embodiments the DAC 540 outputs an intermediate frequency (IF) which is upconverted using a mixer subsystem 550 to the final desired frequency. There are multiple ways the mixing can be done, such as homodyne mixing, heterodyne mixing, etc.

Figure 6:
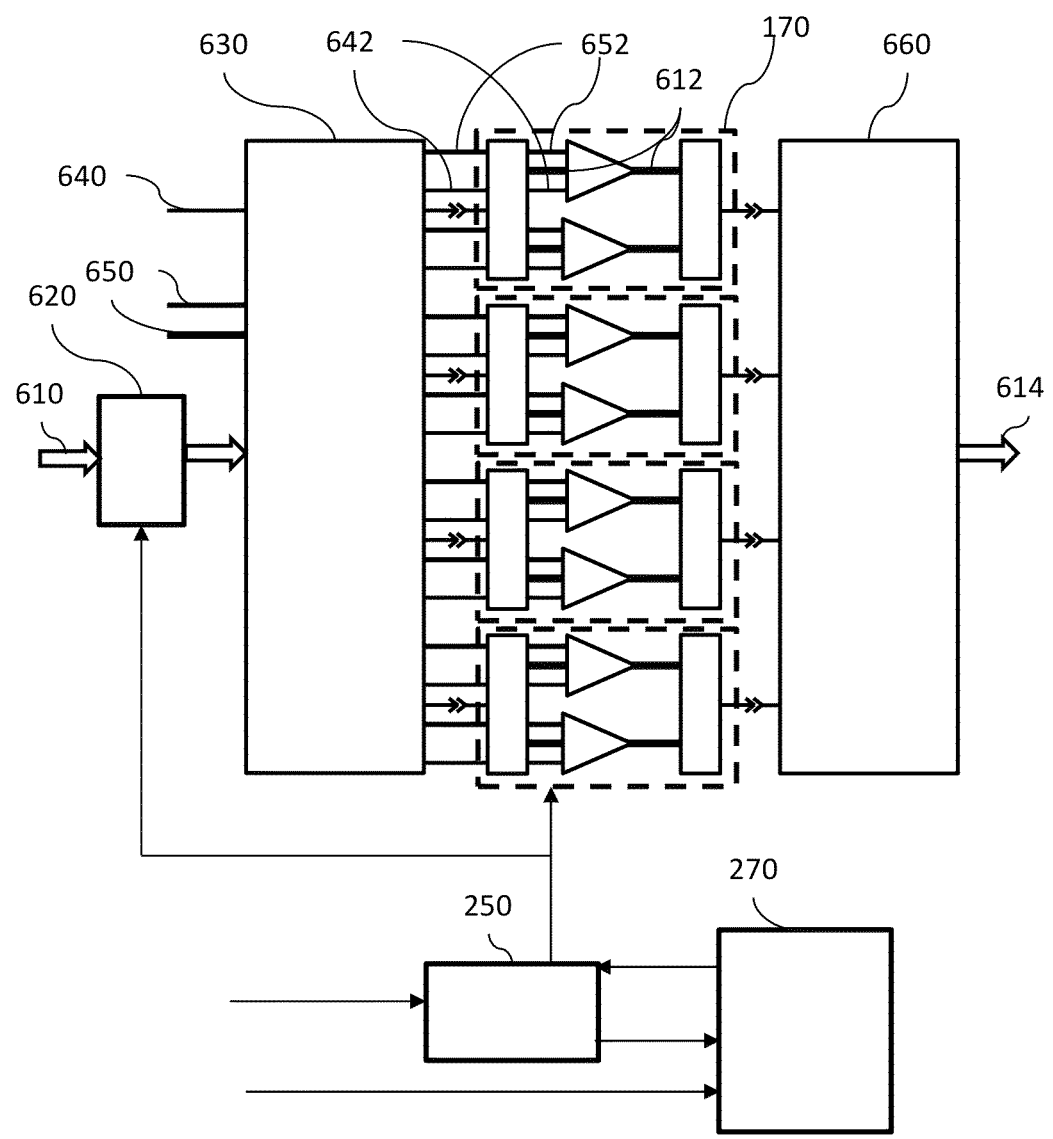
FIG. 6 is a simplified block diagram illustrating a parallel amplifier system, in accordance with certain aspects of the present disclosure.

As illustrated in the example of FIG. 6, the modular aspects of the disclosed amplifier systems can be utilized in a parallel configuration to provide high-gain amplification of an RF input signal 610. In some implementations, a driver amplifier 620 can receive the RF input signal 610 and provide an RF output (e.g., approximately 50 W) to a power divider 630. The power divider 630 can be coupled to modular power amplifiers 170 arranged in parallel and configured to receive and amplify respective RF signals from the power divider 630. Implementations of the disclosed amplifier systems can then result in RF output power of at least 12 kW (e.g., from the combined output of four 3 kW amplified RF signals from modular power amplifiers 170). Optionally, the power divider can receive control signals 640 to control the splitting of the RF input signal. Also, the power divider can have various power channels 650, including inputs and/or returns for AC and/or DC power. The power divider 630 can be a Wilkinson power divider or other circuit that divides the incoming signal power evenly between multiple output channels.

The illustrated examples of modular power amplifiers 170 can be substantially similar to any of those described throughout the present disclosure. However, also shown in the implementation of FIG. 6 are control channels 642 (e.g., for providing control signals to the modular power amplifier 170 and its various components), power channels 652 (e.g., for providing power to various modular power amplifier components), and RF channels (e.g., for directing RF between various power amplifier components).

In some implementations, illustrated for example in FIG. 6, a high-power combiner assembly 660 can be coupled to the modular power amplifiers 170 and configured to combine respective RF output signals from the modular power amplifiers 170. The power combiner assembly can be a Wilkinson power combiner, radial power combiner, or gysel power combiner. In this way, a single, greatly amplified RF output signal 614 can be generated.

As used herein, the term "parallel" can mean geometrically parallel (e.g., disposed in parallel planes) or electrically parallel (e.g., not in series). For example, the block diagram illustrated in FIG. 6 shows how the disclosed system has aspects that are electrically parallel, but not necessarily geometrically parallel. An example implementation having aspects that are specifically not geometrically parallel is shown in FIG. 7, below, where some of the generally planar amplifier circuits are oriented orthogonally to each other.

Figure 7:
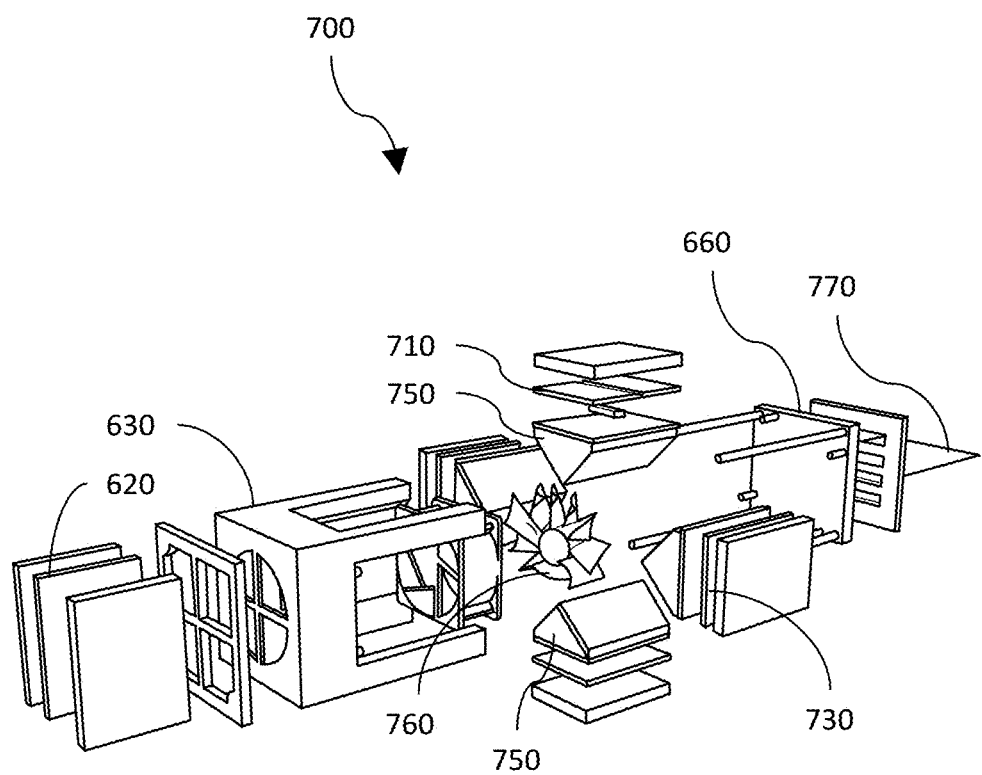
FIG. 7 is a simplified block diagram illustrating a 3D power amplifier, in accordance with certain aspects of the present disclosure.

FIG. 7 illustrates an implementation with a 3D configuration of amplifiers having the benefits of, for example, reduced electromagnetic interference, efficient use of space, and access to cooling mechanisms. As shown in FIG. 7 one implementation of a three-dimensional power amplifier 700 can include a first modular power amplifier 710 configured to receive a first RF signal and output a first amplified RF signal. The three-dimensional modular power amplifier 700 can also have a second modular power amplifier 730 configured to receive a second RF signal and output a second amplified RF signal. In some embodiments, RF input signals can be received by 90 degree hybrids (which may be similar to the 90 degree hybrid 330 in FIG. 3a). RF signals can be similarly power combined into another 90 degree hybrid output block (which may be similar to the 90 degree hybrid 340 in FIG. 3a). Various implementations can have the second high-power amplifier 730 can have a different orientation than the first high-power amplifier 710. Thus, the different orientations can cause a reduction in electromagnetic interference between the first high-power amplifier and the second high-power amplifier. Also, antenna 770, for three-dimensional power amplifier 700, can optionally be part of antenna array 190 depicted in the implementation of FIG. 1.

As used herein, the term "orientation" refers to an orientation of the high-power amplifier in 3D space. For example, the high-power amplifier may be a somewhat planar circuit oriented generally horizontally. As described above, a different high-power amplifier may have a different orientation (e.g., generally vertically). Because such high-power amplifiers may generally be of substantially similar construction, it would be understood by a person of skill what it means to have two high power amplifiers have different orientations. Furthermore, while the present disclosure contemplates that high-power amplifiers may have different orientations, this can also include other circuitry (besides the high-power amplifiers) such as the 90° hybrids, splitters, FPGAs, etc. Any combination of the components disclosed herein that are associated with a given high-power amplifier can thus have a particular orientation which may be different than any other combination of components associated with another high-power amplifier.

Some implementations can include the first high-power amplifier and/or the second high-power amplifier being of generally planar construction and the generally planar amplifiers can have different orientations. Accordingly, in some implementations, the first high-power amplifier and the second high-power amplifier can be constructed on printed circuit boards and disposed to have the different orientations.

The present disclosure contemplates the non-parallel orientations of these high-power amplifiers can mitigate electromagnetic interference between the amplifiers by, for example, reducing interference (constructive or destructive). When the present disclosure notes that two amplifiers are "not in the same plane," this means that they are non-coplanar but may be in parallel planes. When high-power amplifiers (or other circuitry) has the same orientation, metal shielding can be included around one or more locations to mitigate EMI. In some embodiments, some portions of the disclosed system can have high-power amplifiers parallel to each other, either vertically or horizontally. This can be in combination with any non-parallel arrangements of circuits, as discussed below and elsewhere herein.

As shown in FIG. 7, the different orientations can have an angle of 90 degrees between them to form a portion of a square (or rectangular) distribution of high-power amplifiers. Orienting at a 90 degrees angle around a heat sink, (such as a piece of metal or a fan) also helps to ease thermal constraints and remove heat.

In other implementations, the different orientations can have an angle of 120 degrees between them to form a portion of a hexagonal distribution of modular power amplifiers. In yet other implementations, the different orientations can have an angle of 60 degrees between them to form a portion of a triangular distribution of modular power amplifiers. In general, any geometric distribution of modular power amplifiers is contemplated, further including parallelograms or other polygonal or irregular shapes. In this way, most generally, the present disclosure contemplates that at least two of the power amplifiers may not be geometrically parallel, for at least the above-described benefits of heat removal and reduction of EMI.

As shown in FIG. 7, in other implementations, there can be a third high-power amplifier having an orientation substantially perpendicular to the first high-power amplifier and a fourth high-power amplifier having an orientation substantially perpendicular to the second high-power amplifier. Such a configuration is similar to the square distribution described above, but also includes parallelogram-shaped distributions.

As discussed, the disclosed three-dimensional power amplifier has several technical advantages, including improved cooling due to the ability to of, for example, generally planar modular power amplifiers, to have their planes facing a cooling element. This can expose an increased surface area to a cooling element and thus improve cooling. Cooling elements can include, for example, a heat sinks, fans, etc. with number and any sort of cooling element implemented. As shown in FIG. 7, there can be a cooling component (e.g., heat sink 750) located proximate to the first high-power amplifier or the second high-power amplifier. Also, a fan 760 can be included to provide direct air cooling over the amplifier circuitry and heat sinks.

The amplifier designs contemplated herein provide improved mitigation of electromagnetic interference. In some implementations, this can include providing electromagnetic shielding between the first high-power amplifier and the second high-power amplifier. Such electromagnetic shielding can include, for example, Faraday cages, RF absorptive foam, RF reflective materials, etc. In some implementations, such shielding can be located around or between modular power amplifiers.

Some implementations can provide further mitigation by virtue of the separation between any adjacent parallel modular power amplifiers. For example, the first high-power amplifier and the second high-power amplifier can be configured to receive the first RF signal and the second RF signal, both signals having a wavelength, and the first high-power amplifier and the second high-power amplifier are separated by at least approximately half of the wavelength. In some embodiments, the amplifiers can be separated by less than half a wavelength. Such arrays can be challenging to integrate from a mechanical packaging standpoint due to the tight spacing, but can provide higher power per unit area. In other embodiments, the amplifier modules are separated by more than half a wavelength. Any spacing more than half a wavelength can cause a smaller grating-lobe free field of regard. At a half-wavelength spacing, a beam can be scanned over a 180 degree field of regard from the array. As the spacing increases up to lambda (the wavelength), the grating lobe free field of regard is reduced. In one a 0.7 lambda spacing can be used, which allows more space to fit the modules but also allows a larger area for the antenna array. As the gain is related to the area of the antenna array, moving out the modules enables higher gain. Separations can include, for example, 5 inches, which can be appropriate for some L-band phased array application. Other separations are contemplated, based on the wavelength of the RF being amplified, as discussed above, or other separations that act to mitigate interference. In some implementations, the wavelength used is the wavelength of the highest frequency being used in the design.

Figure 8:
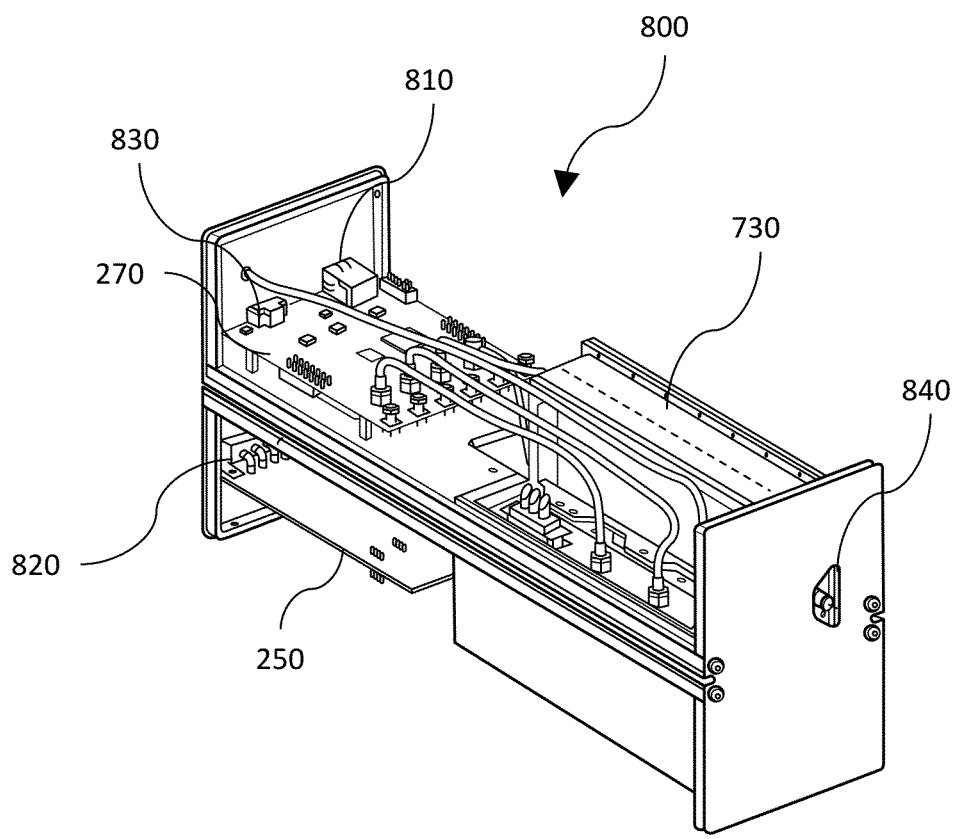
FIG. 8 is a simplified diagram illustrating power amplifier module, in accordance with certain aspects of the present disclosure.

As shown in FIG. 8, an exemplary power amplifier module 800 can include many of the components disclosed herein, allowing, for example, efficient replacement of damaged or upgraded modules. For example, the power amplifier module 800 can include an RF input port 810, a power input port 820, a digital control port 830, and an RF output port 840. Such ports simplify the connections needed to operate and maintain the amplifier system.

Figure 9:
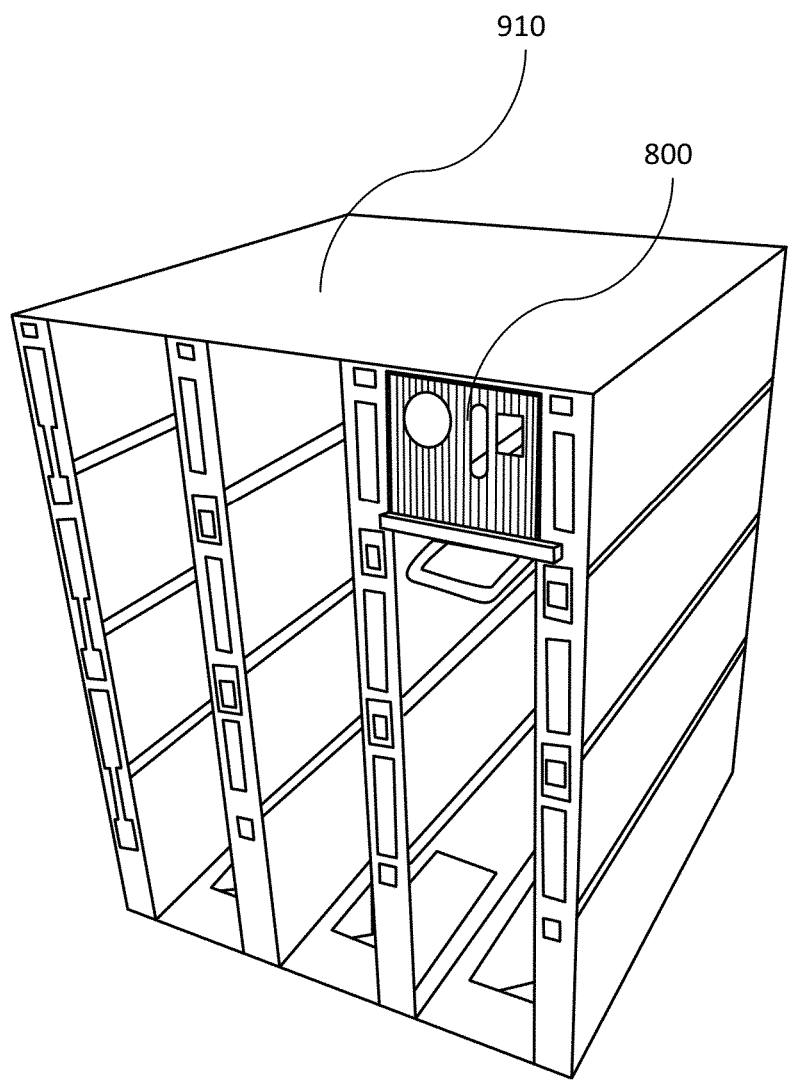
FIG. 9 is a simplified diagram illustrating a rack for multiple power amplifier modules, in accordance with certain aspects of the present disclosure.

FIG. 9 illustrates an exemplary rack 910 suitable for holding one or more power amplifier modules 800. The rack 910 can be a lattice-shaped structure configured to receive any number of power amplifier modules. Rack 910 can include guides and spacers between installed power amplifier modules to enable the proper alignment and spacing to enable various improves disclosed herein, such as required wavelength separations or incorporating shielding into the structure of the rack for further EMI mitigation.

In the following, further features, characteristics, and exemplary technical solutions of the present disclosure will be described in terms of items that may be optionally claimed in any combination:

Item 1: A system comprising a modular power amplifier comprising a power amplifier subsystem comprising a first 90 degree hybrid block configured to receive an RF signal and output a split RF signal with components having a 90 degree phase shift; a second 90 degree hybrid block configured to receive and combine the split RF signal by removing the 90 degree phase shift; and a high-power amplifier configured to amplify at least one of the components of the split RF signal; a power distribution module configured to regulate an amount of power input to the high-power amplifier; and a power sequencer configured to control the timing of power delivery by the power distribution module.

Item 2: The system of any one of the preceding items, the first 90 degree hybrid block further comprising a resistor configured to dissipate at least a portion of RF power going through the first 90 degree hybrid block when the RF power is above a threshold.

Item 3: The system of any one of the preceding items, comprising a plurality of power amplifier subsystems, each of the power amplifier subsystems including the first hybrid block and the second hybrid block, where at least one of the plurality of the power amplifier subsystems replaces a high-power amplifier in another of the plurality of power amplifier subsystems to form a scaled power amplifier assembly.

Item 4: The system of any one of the preceding items, wherein the plurality of power amplifier subsystems includes at least four power amplifier subsystems to form the scaled power amplifier assembly.

Item 5: The system of any one of the preceding items, further comprising: a power divider coupled to a plurality of the modular power amplifiers arranged in parallel and configured to receive and amplify respective RF signals from the power divider; and a high-power combiner assembly coupled to the plurality of the modular power amplifiers and configured to combine respective RF output signals from the plurality of the modular power amplifiers.

Item 6: The system of any one of the preceding items, further comprising waveform generation circuitry comprising: a field-programmable gate array and a digital-to-analog converter, together configured to receive digital commands and a clock synchronization signal and to output the RF signal to the power amplifier subsystem; and a phase lock loop circuit configured to provide clocking to the power amplifier synchronized with the clock synchronization signal.

Item 7: The system of any one of the preceding items, wherein the digital-to-analog converter is configured to output an intermediate frequency of the RF signal, and the system further comprising: a mixer subsystem configured to upconvert the RF signal from the intermediate frequency to a final frequency going into the power amplifier subsystem.

Item 8: The system of any one of the preceding items, further comprising waveform generation circuitry comprising: a direct digital synthesizer chip configured to receive digital commands and a clock synchronization signal and to output the RF signal to the power amplifier subsystem; and a phase lock loop circuit configured to provide clocking to the power amplifier synchronized with the clock synchronization signal.

Item 9: A system comprising: a power amplifier subsystem comprising: a splitter configured to split an RF signal into a first RF component and a second RF component; a first high-power amplifier configured to amplify and output the first RF component; and a second high-power amplifier configured to amplify and output the second RF component; and a differential antenna having a first input operatively connected to the first high-power amplifier to receive the first RF component and a second input operatively connected to the second high-power amplifier to receive the second RF component.

Item 10: The system of any one of the preceding items, wherein the differential antenna is a high-impedance low-profile aperture.

Item 11: The system of any one of the preceding items, further comprising a connected dipole array or a long-slot array antenna, either including a plurality of the high-impedance low-profile apertures.

Item 12: A system comprising: a modular power amplifier having two power amplifier subsystems, each comprising: a first 90 degree hybrid block configured to receive an RF signal and output a split RF signal with components having a 90 degree phase shift; a high-power amplifier configured to amplify at least one of the components of the split RF signal; and a second 90 degree hybrid block configured to receive, combine, and output the split RF signal by removing the 90 degree phase shift; and a differential antenna configured to receive the output of the second 90 degree hybrid blocks of the two power amplifier subsystems.

Item 13: A three-dimensional power amplifier comprising: a first high-power amplifier configured to receive a first RF signal and output a first amplified RF signal; and a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

Item 14: The three-dimensional power amplifier of any one of the preceding items, wherein the first high-power amplifier and the second high-power amplifier are of generally planar construction and the generally planar amplifiers have the different orientations.

Item 15: The three-dimensional power amplifier of any one of the preceding items, wherein the first high-power amplifier and the second high-power amplifier are constructed on printed circuit boards and disposed to have the different orientations.

Item 16: The three-dimensional power amplifier of any one of the preceding items, wherein the different orientations have an angle of 90 degrees between them to form a portion of a square distribution of high-power amplifiers.

Item 17: The three-dimensional power amplifier of any one of the preceding items, wherein the different orientations have an angle of 120 degrees between them to form a portion of a hexagonal distribution of high-power amplifiers.

Item 18: The three-dimensional power amplifier of any one of the preceding items, wherein the different orientations have an angle of 60 degrees between them to form a portion of a triangular distribution of high-power amplifiers.

Item 19: The three-dimensional power amplifier of any one of the preceding items, further comprising a third high-power amplifier having an orientation substantially perpendicular to the first high-power amplifier and a fourth high-power amplifier having an orientation substantially perpendicular to the second high-power amplifier.

Item 20: The three-dimensional power amplifier of any one of the preceding items, further comprising a cooling component located between the first high-power amplifier and the second high-power amplifier.

Item 21: The three-dimensional power amplifier of any one of the preceding items, further comprising electromagnetic shielding adjacent the first high-power amplifier or the second high-power amplifier.

Item 22: The three-dimensional power amplifier of any one of the preceding items, wherein the first high-power amplifier and the second high-power amplifier are configured to receive the first RF signal and the second RF signal, both signals having a wavelength, and the first high-power amplifier and the second high-power amplifier are separated by at least approximately half of the wavelength.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" (or "computer readable medium") refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" (or "computer readable signal") refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, computer programs and/or articles depending on the desired configuration. Any methods or the logic flows depicted in the accompanying figures and/or described herein do not necessarily require the particular order shown, or sequential order, to achieve desirable results. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. The implementations described above can be directed to various combinations and subcombinations of the disclosed features and/or combinations and subcombinations of further features noted above. Furthermore, above described advantages are not intended to limit the application of any issued claims to processes and structures accomplishing any or all of the advantages.

Additionally, section headings shall not limit or characterize the invention(s) set out in any claims that may issue from this disclosure. Further, the description of a technology in the "Background" is not to be construed as an admission that technology is prior art to any invention(s) in this disclosure. Neither is the "Summary" to be considered as a characterization of the invention(s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention(s), and their equivalents, that are protected thereby.

What is claimed is:

1. A system comprising a modular power amplifier comprising:
   a power amplifier subsystem comprising:
      a first 90 degree hybrid block configured to receive an RF signal and output a split RF signal with components having a 90 degree phase shift;
      a second 90 degree hybrid block configured to receive and combine the split RF signal by removing the 90 degree phase shift; and
      a high-power amplifier configured to amplify at least one of the components of the split RF signal;
   a power distribution module configured to regulate an amount of power input to the high-power amplifier; and
   a power sequencer configured to control the timing of power delivery by the power distribution module.

2. The system of claim 1, the first 90 degree hybrid block further comprising a resistor configured to dissipate at least a portion of RF power going through the first 90 degree hybrid block when the RF power is above a threshold.

3. The system of claim 1, comprising a plurality of power amplifier subsystems, each of the power amplifier subsystems including the first hybrid block and the second hybrid block, where at least one of the plurality of the power amplifier subsystems replaces a high-power amplifier in another of the plurality of power amplifier subsystems to form a scaled power amplifier assembly.

4. The system of claim 3, wherein the plurality of power amplifier subsystems includes at least four power amplifier subsystems to form the scaled power amplifier assembly.

5. The system of claim 1, further comprising:
   a power divider coupled to a plurality of the modular power amplifiers arranged in parallel and configured to receive and amplify respective RF signals from the power divider; and
   a high-power combiner assembly coupled to the plurality of the modular power amplifiers and configured to combine respective RF output signals from the plurality of the modular power amplifiers.

6. The system of claim 1, further comprising waveform generation circuitry comprising:
   a field-programmable gate array and a digital-to-analog converter, together configured to receive digital commands and a clock synchronization signal and to output the RF signal to the power amplifier subsystem; and
   a phase lock loop circuit configured to provide clocking to the power amplifier synchronized with the clock synchronization signal.

7. The system of claim 6, wherein the digital-to-analog converter is configured to output an intermediate frequency of the RF signal, and the system further comprising:
   a mixer subsystem configured to upconvert the RF signal from the intermediate frequency to a final frequency going into the power amplifier subsystem.

8. The system of claim 1, further comprising waveform generation circuitry comprising:
   a direct digital synthesizer chip configured to receive digital commands and a clock synchronization signal and to output the RF signal to the power amplifier subsystem; and
   a phase lock loop circuit configured to provide clocking to the power amplifier synchronized with the clock synchronization signal.

9. A three-dimensional power amplifier comprising:
   a first high-power amplifier configured to receive a first RF signal and output a first amplified RF signal;
   a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier, wherein the different orientations have an angle of 90 degrees between them to form a portion of a square distribution of high-power amplifiers; and
   a third high-power amplifier having an orientation substantially perpendicular to the first high-power amplifier and a fourth high-power amplifier having an orientation substantially perpendicular to the second high-power amplifier.

10. The three-dimensional power amplifier of claim 9, wherein the first high-power amplifier and the second high-power amplifier are of generally planar construction and the generally planar amplifiers have the different orientations.

11. The three-dimensional power amplifier of claim 9, wherein the first high-power amplifier and the second high-power amplifier are constructed on printed circuit boards and disposed to have the different orientations.

12. The three-dimensional power amplifier of claim 9, further comprising a cooling component located between the first high-power amplifier and the second high-power amplifier.

13. The three-dimensional power amplifier of claim 9, further comprising electromagnetic shielding adjacent the first high-power amplifier or the second high-power amplifier.

14. The three-dimensional power amplifier of claim 9, wherein the first high-power amplifier and the second high-power amplifier are configured to receive the first RF signal and the second RF signal, both signals having a wavelength, and the first high-power amplifier and the second high-power amplifier are separated by at least approximately half of the wavelength.

* * * * *